(12) United States Patent
Houston et al.

(10) Patent No.: US 6,569,741 B2
(45) Date of Patent: May 27, 2003

(54) HYDROGEN ANNEAL BEFORE GATE OXIDATION

(75) Inventors: Theodore W. Houston, Richardson, TX (US); Sreenath Unnikrishnan, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 54 days.

(21) Appl. No.: 09/961,213

(22) Filed: Sep. 21, 2001

(65) Prior Publication Data

US 2002/0036324 A1 Mar. 28, 2002

Related U.S. Application Data

(60) Provisional application No. 60/235,096, filed on Sep. 25, 2000.

(51) Int. Cl.[7] ............................................. H01L 21/336
(52) U.S. Cl. ........................ 438/290; 438/289; 438/291; 438/308
(58) Field of Search ................................. 438/585, 289, 438/290, 291, 308

(56) References Cited

U.S. PATENT DOCUMENTS 5,362,685 A * 11/1994 Gardner et al. ............. 438/211
6,008,128 A * 12/1999 Habuka et al. ............. 438/695
6,207,591 B1 * 3/2001 Aoki et al. .................. 438/795

* cited by examiner

*Primary Examiner*—Trung Dang
(74) *Attorney, Agent, or Firm*—Jacqueline J. Garner; W. James Brady, III; Frederick J. Telecky, Jr.

(57) ABSTRACT

A process for preparing a silicon surface for gate dielectric formation. The silicon is annealed in a hydrogen ambient prior to gate dielectric formation. The gate dielectric is then formed, along with other layers of the gate structure. The channel is then implanted with an ion implant through the gate material.

9 Claims, 3 Drawing Sheets

HYDROGEN ANNEAL BEFORE GATE OXIDATION

This application claims priority under 35 USC §119(e)(1) of provisional application Nos. 60/235,096 filed Sep. 25, 2000.

BACKGROUND AND SUMMARY OF THE INVENTION

The present invention relates to integrated circuit structures and fabrication methods, and more particularly to formation of gate structures in an integrated circuit process.

BACKGROUND

Integrated circuits are made up of millions of devices, and the drive for greater computational power and speed drives devices to smaller and smaller scales. This allows devices to be more densely packed, which allows more devices to be placed on a single chip one important constraint on device size is the ability to form high quality low defect very thin gate dielectrics.

Surfaces of solids and interfaces between materials play an important role in semiconductor technology. The ability to lay a thin oxide layer for the gate structure depends in part on the surface of the silicon substrate. It is highly desirable to have a very smooth surface prior to gate oxide formation.

Gate oxide is a very important step in integrated circuit construction, and the need to form a high quality, defect free, very thin oxide without contamination makes gate oxidation a key step in MOS processing. The gate oxide needs to be as thin as possible, in the range of angstroms. The gate oxide will determine many qualities that affect a transistor's function. Though the oxide is usually made very thin, any holes in the oxide can cause problems such as shorting the substrate to the gate. The smoothness of the underlying surface affects the quality of the gate oxide layer greatly because of this.

Typically, to get a high quality oxide, the previous oxide layer is stripped from the gate region and a new gate oxide is formed. The new gate oxides are usually formed slowly and carefully by dry oxidation. The remaining gate material is then normally formed over the gate oxide. Polysilicon is the standard gate material and is usually formed using CVD methods.

One of the most important uses for ion implantation is for MOS gate threshold voltage adjustment. No current can flow between the source and drain until the channel forms beneath the gate, conductively connecting the source and drain. The amount of voltage necessary for this to occur is the threshold voltage of the device. The threshold voltage is very sensitive to the dopant concentration of the channel. Threshold voltage is an important parameter, in part because a lower threshold voltage means fewer power supplies and faster circuits.

The work function between the gate material and the doping level in the semiconductor determines the threshold voltage. Ion implantation is a typical technique used to control doping levels in semiconductors.

Ion implantation is used to inject dopants into a material. Unlike diffusion, which is a chemical process, ion implantation is a physical process. Dopant atoms are ionized and accelerated in a beam which is directed at the required wafer location. The dopant atoms enter the target material and come to rest below the surface. Ion implantation is the preferred doping technique for dense and small feature circuits because of its control and the lack of lateral diffusion.

Ion implantation of dopants into the channel is typically accomplished before the gate layers are formed. The timing of the implant depends on other process steps, since some of the environmental requirements of process steps (such as high temperature) can cause redistribution of implants.

Hydrogen Anneal Before Gate Oxidation

The present application discloses an innovative process for smoothing a surface prior to gate dielectric formation. The process uses a hydrogen anneal, followed by formation of part of the gate structure (preferably the gate dielectric, followed by a layer of TiN, a layer of polysilicon, an oxide layer, and a nitride layer). The channel implant is done after at least some of the gate structure is formed, preferably those listed above. This prevents diffusion of the implanted ions, which could occur if the silicon surface were annealed before the gate structure were formed.

Advantages of the disclosed methods and structures, in various embodiments, can include one or more of the following:

hydrogen anneal leaves Si surface clean and reconstructed;
 better gate dielectric integrity, especially for thinner gate dielectrics;
 more uniform transistor characteristics.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The preferred embodiment includes an annealing process that results in an atomically smooth silicon surface prior to forming the gate dielectric. A hydrogen anneal is used to smooth the surface. If the channel implant were done before the annealing process, the anneal would cause redistribution of the channel implant. To solve this problem, the innovative process does not include the channel implant until after the gate oxide is laid. In the preferred embodiment, only a part of the gate structure is formed before the implant proceeds. Additional gate materials can be added after the channel implant.

The annealing process has a low thermal budget so that it can be included in the standard CMOS flow. The low thermal budget anneal is preferably done in a pure hydrogen ambient after an HF-last or other wet clean that results in a native-oxide free and atomically flat step and terrace structure. The gate oxide formation is then performed on this surface. An integrated cluster tool is used to accomplish this two-step process.

In the preferred embodiment, the anneal is done in high purity hydrogen ambient at about 850 to 950 C for a duration of 30 seconds to 2 minutes. The $H_2$ purity is around 10 to 100 ppb. This results in a reordering of the silicon surface to the desired step and terrace shape with a resulting reduction in surface roughness.

Figure 1:
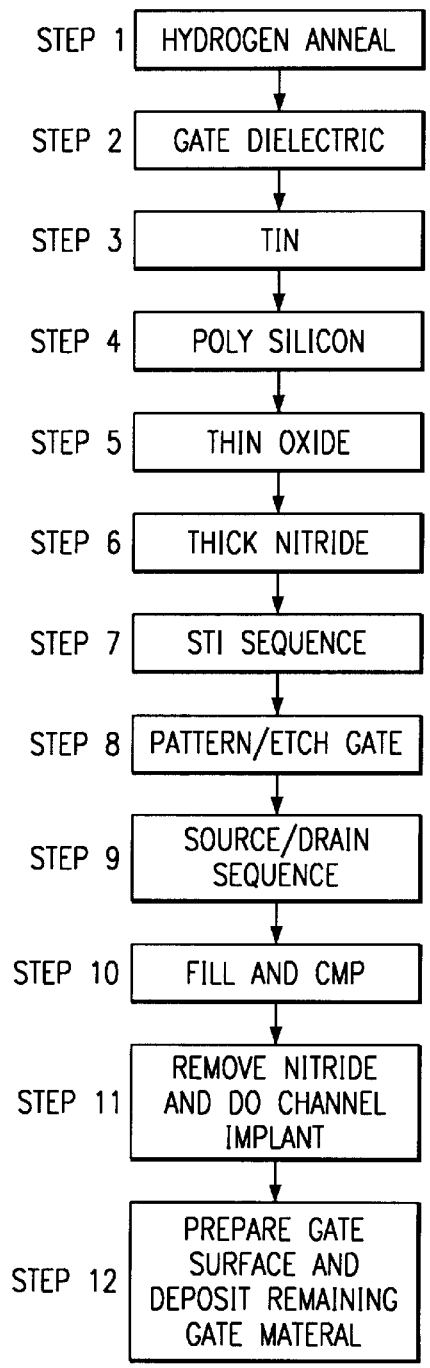
FIG. 1 shows a flowchart of the presently preferred embodiment.
Figure 2:
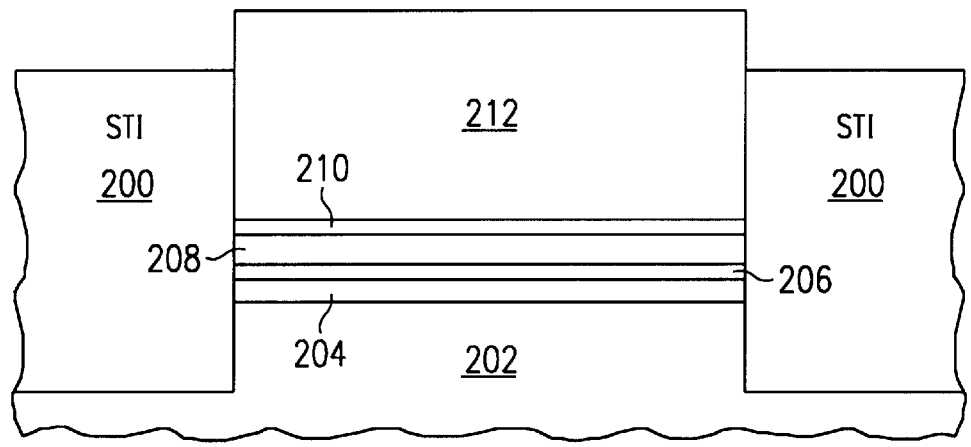
FIG. 2 shows a device at an interim process step.
Figure 3:
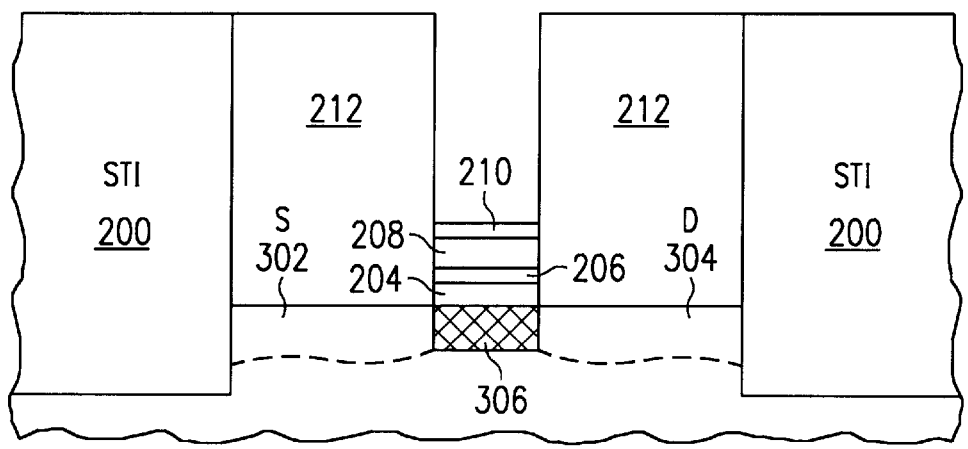
FIG. 3 shows a device at an interim process step.

The preferred embodiment is described with reference to the figures. FIG. 1 shows a flowchart of the process flow for a smoothing technique done before formation of the gate oxide. The surface is first smoothed using a hydrogen anneal at 850–950 C for 30 seconds to 2 minutes (though other embodiments may vary these specifications) (Step 1). After the surface has been smoothed, the gate dielectric is formed (Step 2). This is followed by a thin layer of TiN (Step 3) and a layer of silicon (Step 4), as shown in FIG. 2, discussed further below. Depending on the work function desired, materials such as TiN may or may not be deposited, with or without a following layer of Si. The silicon in Step 4 can be poly or amorphous silicon (preferably amorphous). A relatively thin layer of $SiO_2$ is then formed (Step 5), followed by a thick nitride layer (Step 6). The STI (shallow trench isolation) sequence is then followed (Step 7). Next, the gate is patterned (Step 8). The usual source and drain sequence is then followed (Step 9), including source and drain implants. Next, a fill and CMP (chemical mechanical polish) follow (Step 10). The nitride layer is then removed by etching and the channel implant is done next (Step 11). The channel implant does not reach the source or drain, as shown in FIG. 3. In FIG. 3, the material above the source 302 and drain 304 does not allow the channel implant to reach the source 302 and drain 304. Only the silicon below the gate 306 is reached by the implanted ions. This aspect of the process resembles a disposable gate process, in that material is formed on the edge of the gate region that is later removed. This material limits the implant to the channel.

Next the gate surface is prepared (e.g., with a HF dip) and the second gate material is formed (Step 12). These materials could include metal layers for conductivity, tungsten for instance. This is followed by more patterning and etching or CMP as required by the particular process.

The critical dimension for the gate in this process is on the order of 0.1 micron or less. The gate oxide has a thickness of about 15–20 angstroms, the TiN layer has a thickness of about 200 angstroms, the poly layer has a thickness of about 500 angstroms, the oxide layer has a thickness of about 200 angstroms, and the nitride layer has a thickness of about 2000 angstroms. These dimensions are not exact for all possible processes, and their numbers could be greatly varied while still practicing the present innovations.

The process is preferably done in-situ to minimize the chance of contamination between the hydrogen anneal and formation of the gate dielectric. However, it is not necessary to form the gate dielectric in the same chamber as the anneal.

The present innovations could be incorporated into different process flows just before the gate dielectric is formed. The $H_2$ anneal could be included in the process flow, for instance, after shallow trench isolation (STI). Alternatively, smoothing could be done by the wafer vendor, and gate oxide could then be the first step in the process flow.

This innovative process can be readily extended to include a selective epitaxial growth step for channel dopant profile engineering.

FIG. 2 shows part of the transistor structure. On either side the device is isolated by STI 200 that extends into the substrate 202. The gate dielectric 204 is the first layer, followed by a thin TiN layer 206. Atop the TiN layer is a layer of polysilicon 208, followed by an oxide layer 210. Next, a thick nitrogen layer is shown 212.

Figure 4:
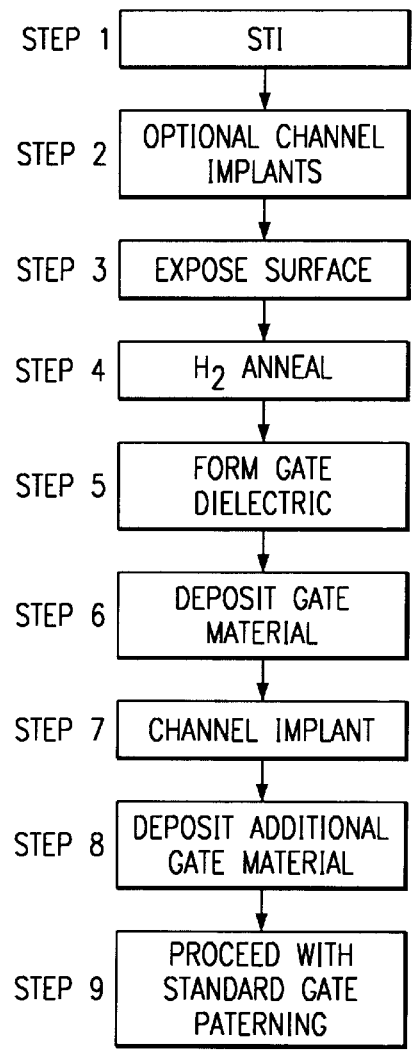
FIG. 4 shows an alternate flow chart for practicing the present innovations.

FIG. 4 shows an alternate process flow for implementing the present innovations. This process starts at the STI (Step 1), followed by optional channel implants (Step 2). It is preferable to defer the implants to a later step (see Step 7, below) so the anneal does not redistribute the implanted channel dopants. The surface is then exposed (Step 3) in preparation for the hydrogen anneal (step 4). Next the gate dielectric is formed (Step 5), followed by formation of added gate material (Step 6). In Step 6, an option is to form only part of the gate structure (e.g., amorphous silicon) before the channel implant (Step 7). Following the channel implant, any necessary additional gate material is formed (Step 8). The process then continues with standard gate patterning, S/D implants, etc. (Step 9).

Whatever particular variation of process flow is used, there are preferably no steps that can damage the surface between the smoothing anneal and the gate dielectric formation.

The channel implant through the gate can have advantages independent of the ability to form the gate dielectric immediately after smoothing. Some possible advantages of the through-gate implant can include a reduction in the number of mask steps and a reduction in the thermal budget seen by the channel implant, allowing a more precise channel profiling. This has been done with SOI where channel implant in the source and drain area goes harmlessly into the buried oxide (BOX). The present innovative process extends this possibility to bulk.

Figure 5:
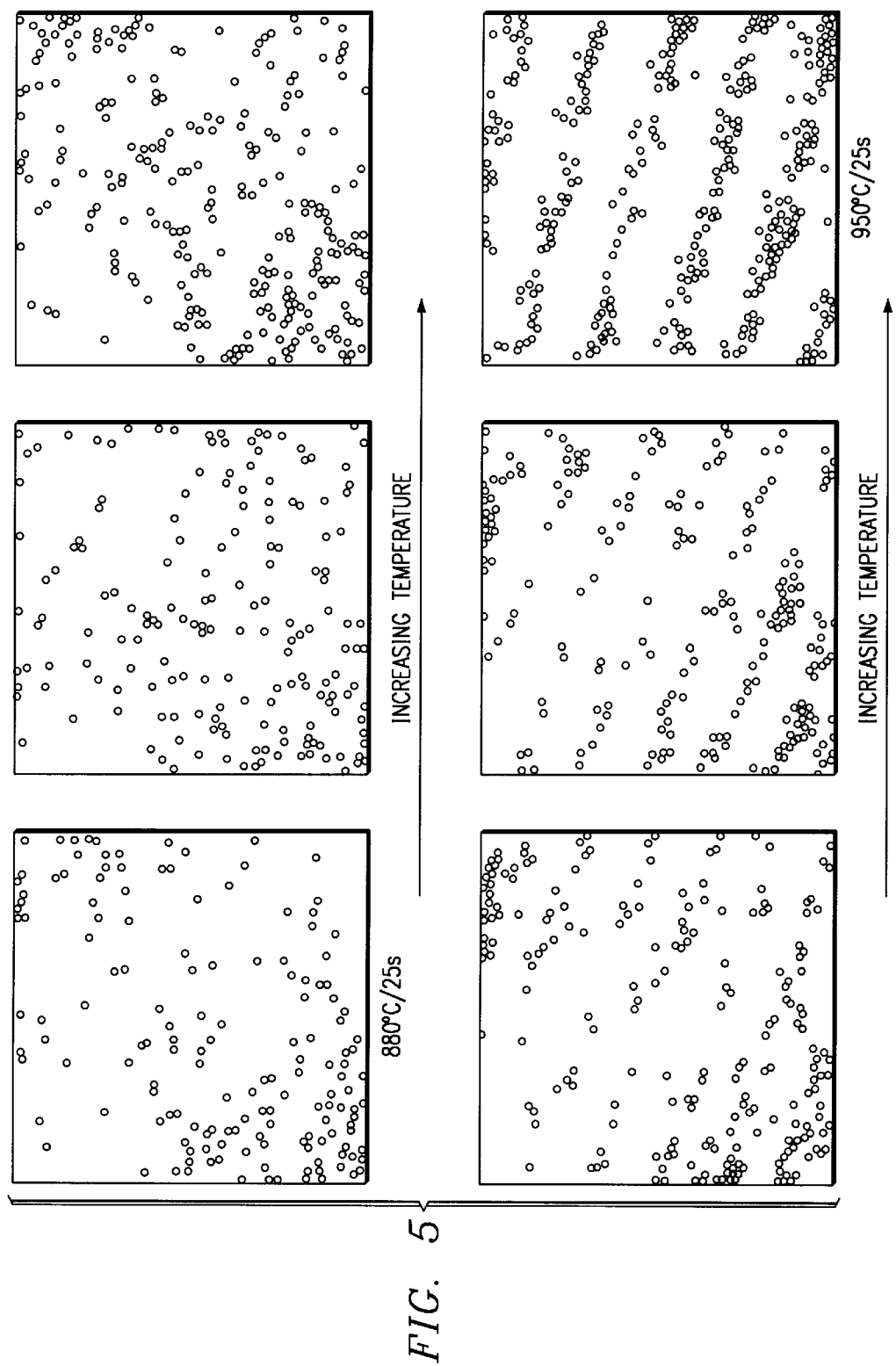
FIG. 5 shows the surface of the silicon annealed at different temperatures.

The purity, pressure, and temperature of the hydrogen anneal can create great differences in the annealed silicon. A low thermal budget hydrogen bake will leave the silicon surface clean and reconstructed. The evolution of terrace and step structure on the silicon surface through hydrogen bakes are shown in FIG. 5. In these six photos, the temperature differs at which the hydrogen anneal was done. In the lower temperature bakes (upper left), the photo shows a granular, randomly speckled surface. As the bake is done at higher and higher temperatures, the desired step and terrace structure arises. The bottom right photo, the highest temperature, shows a clearly defined structure on the surface of the silicon after the anneal. While vacuum bakes produce mound defects, higher hydrogen pressure reduces the surface contamination and favors reconstruction. FIG. 5 shows the silicon surface is smooth to the atomic level. This smoothness gives better gate dielectric integrity, especially for tin gate dielectrics. More uniform gate dielectric levels also cause more uniform transistor characteristics.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

Though the preferred embodiment mentions specific process steps, the innovations of the present application can be implemented with various process steps, including others that are not mentioned in the preferred embodiment or reordered steps that are mentioned in this specification.

The teachings above are not necessarily strictly limited to silicon. In alternative embodiments, it is contemplated that these teachings can also be applied to structures and methods using other semiconductors, such as silicon/germanium and related Group IV alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Silicon Processing for the VLSI Era, Wolf, Lattice Press (1990); Microchip Fabrication, Van Zant, McGraw hill (1997).

What is claimed is:

1. A field-effect transistor fabrication method, comprising the steps of:

performing all pregate steps;

annealing a semiconductor material in a reducing atmosphere to achieve atomic-scale smoothness;

forming a dielectric on said material;

forming at least part of a thin film gate structure;

introducing a threshold-adjust dosage of dopant material through said dielectric.

2. The fabrication method of claim 1, wherein said reducing atmosphere is an $H_2$ ambient of purity between 10 to 100 parts per billion.

3. The fabrication method of claim 1, wherein said semiconductor material is a Group IV semiconductor material.

4. A field-effect transistor fabrication method, comprising the steps of:

performing all pregate steps;

annealing a Group IV semiconductor material in a hydrogen atmosphere to achieve atomic-scale smoothness;

forming a dielectric on said material in an oxidizing atmosphere;

forming at least part of a thin film gate structure;

implanting a threshold-adjust dosage of dopant material through said dielectric.

5. The fabrication method of claim 4, wherein said part of a thin film gate structure includes a TiN layer and a polysilicon layer.

6. A field-effect transistor fabrication method, comprising the steps of:

fabricating a partial transistor structure including a semiconductor channel region which separates source and drain diffusions;

annealing the surface of said channel region in a reducing atmosphere to achieve atomic-scale smoothness;

forming a gate dielectric on said channel region;

forming at least part of a thin film gate structure over said dielectric;

introducing a threshold-adjust dosage of dopant material through said dielectric.

7. The fabrication method of claim 6, wherein said reducing atmosphere is a hydrogen reducing atmosphere.

8. The fabrication method of claim 6, wherein said step of forming a gate dielectric is performed in an oxidizing atmosphere.

9. The fabrication method of claim 6, wherein said part of a tin film gate structure includes a TiN layer and a polysilicon layer.

* * * * *